(12) United States Patent
Kimura et al.

(10) Patent No.: US 7,791,416 B2
(45) Date of Patent: Sep. 7, 2010

(54) PLL CIRCUIT

(75) Inventors: Hiroki Kimura, Chitose (JP); Tsukasa Kobata, Chitose (JP); Yasuo Kitayama, Chitose (JP); Naoki Onishi, Chitose (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 107 days.

(21) Appl. No.: 12/222,530

(22) Filed: Aug. 11, 2008

(65) Prior Publication Data
US 2009/0021312 A1    Jan. 22, 2009

Related U.S. Application Data

(63) Continuation of application No. PCT/JP2007/053409, filed on Feb. 23, 2007.

(30) Foreign Application Priority Data

Feb. 24, 2006    (JP) .......................... P2006-048463

(51) Int. Cl.
*H03B 1/00* (2006.01)
*H03L 7/06* (2006.01)
*H03L 7/093* (2006.01)

(52) U.S. Cl. ............................. 331/17; 331/25; 331/66

(58) Field of Classification Search ................ 331/1 A, 331/16–18, 25, 66, 176
See application file for complete search history.

(56) References Cited

U.S. PATENT DOCUMENTS 7,183,860 B2 *   2/2007   Staszewski et al. ......... 331/1 A
7,254,507 B2 *   8/2007   Dosho et al. ................ 702/107
2002/0057633 A1 * 5/2002 Nakamura et al. ....... 369/47.25

FOREIGN PATENT DOCUMENTS

| JP | 10-098376   | 4/1998 |
| JP | 11-122101   | 4/1999 |
| JP | 2003-168975 | 6/2003 |
| JP | 2005-033581 | 2/2005 |
| JP | 2006-180428 | 7/2006 |

OTHER PUBLICATIONS

International Search Report dated May 22, 2007.

* cited by examiner

*Primary Examiner*—David Mis
(74) *Attorney, Agent, or Firm*—Jacobson Holman PLLC

(57) ABSTRACT

A PLL circuit which can absorb variation of phase noise characteristic due to temperature and individual difference and has a phase noise suppression characteristic stable in a wide frequency band is provided. The PLL circuit comprises, at the succeeding stage, a first register for storing a first parameter for controlling the loop gain, a first multiplier for multiplying the output of the phase comparator by a first parameter, a second register for storing a second parameter for controlling the response characteristic, a second multiplier for multiplying the output of the first multiplier by a second parameter, and a CPU for setting optimum parameters in the first and second registers depending on the use frequency band, the ambient temperature, and the device individual difference. By controlling the loop gain and the response characteristic to optimum values, a good suppression characteristic in a wide frequency band is achieved.

6 Claims, 7 Drawing Sheets

| TEMPERATURE t (°C) | TEMPERATURE PARAMETER | |
|---|---|---|
| | REGISTER (1) p1 | REGISTER (2) p2 |
| 50 ≦ 70 | 1.2 | 0.6 |
| 30 ≦ t < 50 | 1.1 | 0.7 |
| 10 ≦ t < 30 | 1.0 | 0.7 |
| -10 ≦ t < 10 | 0.9 | 0.8 |
| -30 ≦ t < -10 | 0.8 | 0.8 |

PLL CIRCUIT

This is a Continuation of PCT/JP2007/053409 filed Feb. 23, 2007 and published in Japanese.

BACKGROUND OF THE INVENTION

1. Field of the Invention

The present invention relates to a phase locked loop (PLL) circuit used as a frequency synthesizer, and more particularly, to a PLL circuit that can obtain a stable suppression characteristic of a phase noise in a wide frequency band by preventing the deterioration in phase noise due to a variation in temperature or an individual difference of devices.

2. Description of the Related Art

A frequency synthesizer (hereinafter, referred to as "PLL circuit") employing a PLL is known as a standard signal generator.

The PLL circuit is widely used in base stations for mobile communication or ground digital broadcast, and requires a low and stable phase noise characteristic to reduce interference with the adjacent carriers by narrowing frequency intervals at the time of arranging carriers.

For example, in an OFDM (Orthogonal Frequency Division Multiplexing) method, wideband signals are transmitted using plural sub carriers orthogonal to each other. Accordingly, the deterioration in phase noise characteristic of an OFDM signal causes the frequency unstable and thus the orthogonality of the sub carriers is damaged, thereby not identifying the carriers.

A conventional PLL circuit is described now with reference to FIG. 7. FIG. 7 is a block diagram schematically illustrating a configuration of the conventional PLL circuit.

As shown in FIG. 7, the conventional PLL circuit includes a voltage controlled oscillator (VCO) 1 oscillating a frequency corresponding to a control voltage, a 1/N frequency divider 2 dividing an output frequency of the VCO 1 by 1/N, an A/D converter 3 converting the divided frequency in a A/D (Analog/Digital) conversion manner, a reference oscillator 5 oscillating a reference frequency, a phase comparator 4 comparing the reference frequency with the output of the A/D converter 3, a digital filter 10' as a loop filter integrating a phase difference with respect to time by the use of an integration circuit and outputting a pulse as a control voltage value, a D/A converter 8 converting the control voltage value in a D/A (Digital/Analog) conversion manner, and an analog filter 9 smoothing a signal and outputting a control voltage.

The phase comparator 4 is usually embodied by a PLL IC. A counter is usually used as the frequency divider 2.

In the PLL circuit having the above-mentioned configuration, the oscillation frequency output from the VCO 1 is branched and divided by 1/N by the 1/N frequency divider 2, the divided frequency is converted into a digital signal by the A/D converter 3, and then the digital signal is compared in phase with the reference frequency from the reference oscillator 5 by the phase comparator 4, thereby outputting a phase difference.

The detected phase difference is integrated with respect to a constant time by the digital filter 10' to output an integrated value, the integrated value is converted into an analog signal by the D/A converter 8, the analog signal is smoothed by the analog filter 9 to generated the control voltage, and then the control voltage is sent to the VCO 1. The VCO 1 oscillates a frequency corresponding to the input control voltage. In this way, the PLL circuit performs a feedback control operation of matching the phase of the oscillation frequency of the VCO 1 with the phase of the reference frequency.

In general, the natural frequency fN of the PLL circuit is obtained as $fN=(\sqrt{K0})/2\pi$. Here, K0 represents a loop gain. In the phase noise characteristic, a desired amount of suppressed phase noise is obtained by optimizing the loop gain.

Parameters influencing the loop gain are shown in (1) to (4) of FIG. 7, where four parameters of (1) Kp: phase detection conversion gain, (2) A(s): loop filter transfer function, (3) B: weight by bit in the output of the D/A converter 8, and (4) Kv: VCO conversion gain (VF sensitivity) are shown.

The values of the parameters are calculated by the following expressions:

(1) $Kp=(2\pi A_0^2/fs \times N)fs \times /2\pi$ [V/radian]

(2) $A(s)=fs/N_L$ [V/V]

(3) B is (the output voltage amplitude of the D/A converter 8)/(the number of bits)

(4) Kv is a specific value of the VCO [Hz/V]

Here, $A_0$ is a half of the amplitude of I and Q signals orthogonally detected, fs is a sampling frequency, N is a frequency division ratio of the frequency divider 2, and $N_L$ is a frequency division ratio at the time of integration.

The loop gain K0 is calculated by multiplying the parameters of (1) to (4) shown in FIG. 7.

That is, $K0=(1)\times(2)\times(3)\times(4)=Kp \times A(s) \times B \times Kv$ is calculated. As a result, K0 becomes constant and the amount of suppressed phase noise becomes constant.

As a conventional PLL circuit, "Phase Locked Loop Circuit and Clock Generating Circuit" (applicant: NEC corporation, inventor: Shigesane NOGUCHI) is described in Japanese Unexamined Patent Application Publication No. 2003-168975, published on Jun. 13, H15 (see Patent Document 1).

This conventional PLL circuit is a PLL circuit and a clock generating circuit, which includes a first control loop employing an analog phase comparator and controlling the oscillation on the basis of a phase difference output and a second control loop being oscillated and controlled in accordance with a signal of which a component of the phase difference output in the vicinity of a DC component is enhanced and performing a control operation as a speed lower than that of the first control loop. Accordingly, it is possible to enhance the jitter resistance by suppressing the jitter while enlarging the lock range.

As another PLL circuit, "Fractional-N Phase Locked Loop Frequency Synthesizer" (applicant: Mitsubishi Electric Corporation, inventor: Kenichi TAZIMA) is disclosed in Japanese Unexamined Patent Application Publication No. 2005-33581, published on February 3, H17 (see Patent Document 2).

This conventional PLL circuit is a fractional-N PLL frequency synthesizer in which a feedback circuit generating a synchronization signal from a high-frequency signal of a voltage controlled oscillator includes plural variable frequency dividers dividing a high-frequency signal and outputting a synchronization signal and a modulation circuit outputting control signals of the variable frequency dividers in response to a clock signal in correspondence to the variable frequency dividers. Accordingly, it is possible to perform a high-speed and stable operation.

Patent Document 1: Japanese Unexamined Patent Application Publication No. 2003-168975 (see pages 4 to 7 and FIG. 1)

Patent Document 2: Japanese Unexamined Patent Application Publication No. 2005-33581 (see pages 4 to 7 and FIG. 1)

However, The conventional PLL circuits have a problem that the suppression characteristic of suppressing a phase noise is easily affected by the ambient temperature and a stable suppression characteristic cannot be obtained in an installation place having a great variation in temperature.

The conventional PLL circuits have a problem that the suppression characteristic is also affected by differences in characteristic of components of the PLL circuit, thereby causing individual differences by devices.

The conventional PLL circuits also have a problem that it is difficult to obtain a stable suppression characteristic in a wide frequency band.

SUMMARY OF THE INVENTION

The invention is contrived in view of the above-mentioned problems. An object of the invention is to provide a PLL circuit that can absorb a variation in phase noise characteristic due to a variation in temperature or a difference in characteristic of components and obtain a stable suppression characteristic of suppressing a phase noise in a wide frequency band.

SUMMARY OF THE INVENTION

In order to solve the above-mentioned problems, the invention provides a PLL circuit including a voltage controlled oscillator oscillating a frequency corresponding to a control voltage, a reference frequency oscillator oscillating a constant frequency, a phase comparator comparing the output frequency of the reference frequency oscillator with the output frequency of the voltage controlled oscillator and outputting a phase difference, and a loop filter generating the control voltage on the basis of the phase difference, wherein loop gain varying means for varying a loop gain of the PLL circuit is disposed at an output stage of the phase comparator, wherein the loop gain varying means includes a first register storing a first parameter for adjusting a loop gain and a first multiplier multiplying the first parameter output from the first register by the output of the phase comparator, and wherein the PLL circuit further includes a controller setting the first parameter in the first register on the basis of a device state and a use condition. Accordingly, it is possible to stabilize a suppression characteristic of suppressing a phase noise in a wide frequency band, by adjusting the loop gain, and to optimize the suppression characteristic of suppressing a phase noise in a wide frequency band, by adjusting the loop gain depending on a device state and a use condition.

In order to solve the above-mentioned problems, the invention provides a PLL circuit including a voltage controlled oscillator oscillating a frequency corresponding to a control voltage, a reference frequency oscillator oscillating a constant frequency, a phase comparator comparing the output frequency of the reference frequency oscillator with the output frequency of the voltage controlled oscillator and outputting a phase difference, and a loop filter generating the control voltage on the basis of the phase difference, wherein response characteristic varying means for varying a response characteristic of the PLL circuit is disposed at an output stage of the phase comparator, wherein the response characteristic varying means includes a second register storing a second parameter for adjusting a response characteristic and a second multiplier multiplying the second parameter output from the second register by the output of the phase comparator, and wherein the PLL circuit further includes a controller setting the second parameter in the second register on the basis of a device state and a use condition. Accordingly, it is possible to stabilize a suppression characteristic of suppressing a phase noise in a wide frequency band, by adjusting the response characteristic, and to optimize the suppression characteristic of suppressing a phase noise in a wide frequency band, by adjusting the response characteristic depending on the device state and the use condition.

In order to solve the above-mentioned problems, the invention provides a PLL circuit including a voltage controlled oscillator oscillating a frequency corresponding to a control voltage, a reference frequency oscillator oscillating a constant frequency, a phase comparator comparing the output frequency of the reference frequency oscillator with the output frequency of the voltage controlled oscillator and outputting a phase difference, and a loop filter generating the control voltage on the basis of the phase difference, wherein loop gain varying means for varying a loop gain of the PLL circuit and response characteristic varying means for varying a response characteristic of the PLL circuit are disposed at an output stage of the phase comparator, wherein the loop gain varying means includes a first register storing a first parameter for adjusting a loop gain and a first multiplier multiplying the first parameter output from the first register by the output of the phase comparator, wherein the response characteristic varying means includes a second register storing a second parameter for adjusting a response characteristic and a second multiplier receiving the branched output of the first multiplier and multiplying the second parameter output from the second register by the output of the first multiplier, and wherein the PLL circuit further includes a controller setting the first parameter and the second parameter in the first register and the second register, respectively, on the basis of a device state and a use condition. Accordingly, it is possible to stabilize a suppression characteristic of suppressing a phase noise in a wide frequency band, by adjusting the loop gain and the response characteristic to optimize the suppression characteristic of suppressing a phase noise, and to obtain the stable suppression characteristic in a wide frequency band, by adjusting the loop gain and the response characteristic depending on the device state and the use condition to optimize the suppression characteristic of the phase noise.

In order to solve the above-mentioned problems, the invention is characterized by the PLL circuit further including: a correction value memory storing a temperature table including a first default parameter and a second default parameter as the parameters set in the first and second registers and a first temperature parameter and a second temperature parameter as correction values for correcting the first and second default parameters depending on a temperature in correlation with the temperature so as to compensate for an individual difference of the PLL circuit; and a temperature sensor detecting the temperature, wherein the controller sets a sum of the first default parameter and the first temperature parameter corresponding to the detected temperature as the first parameter in the first register and sets a sum of the second default parameter and the second temperature parameter corresponding to the detected temperature as the second parameter in the second register, with reference to the temperature table depending on the temperature detected by the temperature sensor. Accordingly, the default parameters having been compensated for in individual difference of the device can be additionally corrected depending on the temperature to set the corrected parameters in the first register and the second register, the individual difference or the influence of the variation in temperature can be reduced to obtain the optimal loop gain and response characteristic, thereby stabilizing the suppression characteristic of suppressing a phase noise in a wide frequency band.

In order to solve the above-mentioned problems, the invention is characterized by the PLL circuit, wherein the correction value memory includes the temperature tables corresponding to a plurality of use frequency bands, and wherein when the use frequency band is externally set, the controller refers to the temperature table corresponding to the set use frequency band. Accordingly, it is possible to perform a temperature correction process depending on the use frequency band, thereby stabilizing the suppression characteristic of suppressing a phase noise in a wide frequency band with the high-precision correction.

DESCRIPTION OF REFERENCE NUMERALS

Figure 1:
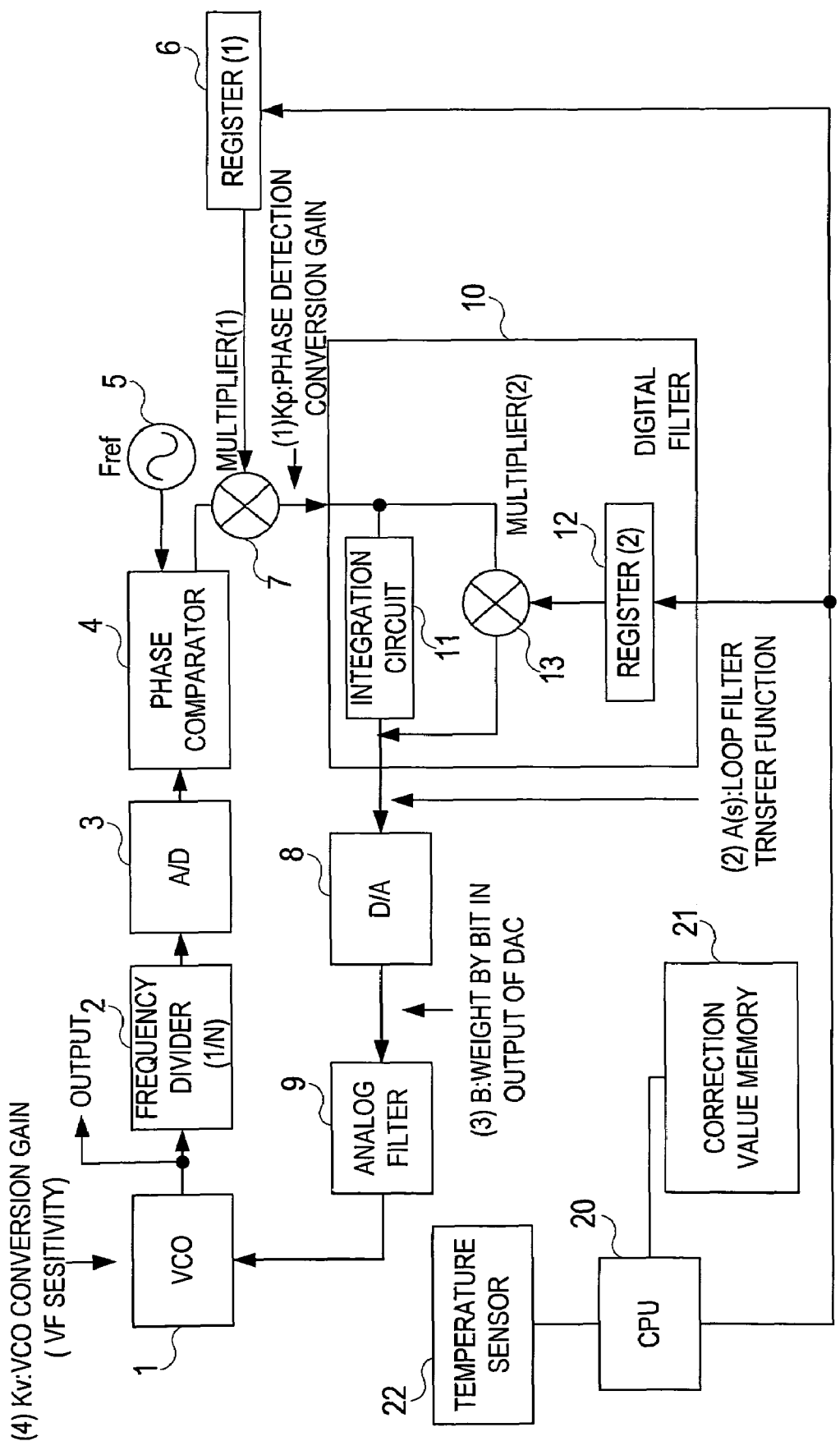
FIG. 1 is a block diagram illustrating a configuration of a PLL circuit according to an embodiment of the invention.

1: VCO
2: 1/N frequency divider
3: A/D converter
4: phase comparator
5: reference oscillator
6: first register
7: first multiplier
8: D/A converter
9: analog filter
10: digital filter
11: integration circuit
12: second register
13: second multiplier
20: CPU
21: correction value memory
22: temperature sensor

DETAILED DESCRIPTION OF THE PREFERRED EMBODIMENTS

Embodiments of the invention will be described with reference to the accompanying drawings.

A PLL circuit according to an embodiment of the invention includes, at a e stage subsequent to a phase comparator, a first register storing a first parameter for adjusting a loop gain, a first multiplier multiplying an output of the phase comparator by the first parameter, a second register storing a second parameter for adjusting a damping factor (response characteristic), a second multiplier multiplying an output of the first multiplier by the second parameter, and a controller setting the optimal parameters in the first and second registers depending on a use frequency band, an ambient temperature, and an individual difference of devices. The PLL circuit can provide a stable suppression characteristic of suppressing a phase noise in a wide frequency band by adjusting the loop gain and the damping factor into the optimal values on the basis of the use frequency band, the ambient temperature, and the individual difference of devices.

FIG. 1 is a block diagram illustrating a configuration of the PLL circuit according to the embodiment of the invention.

Figure 7:
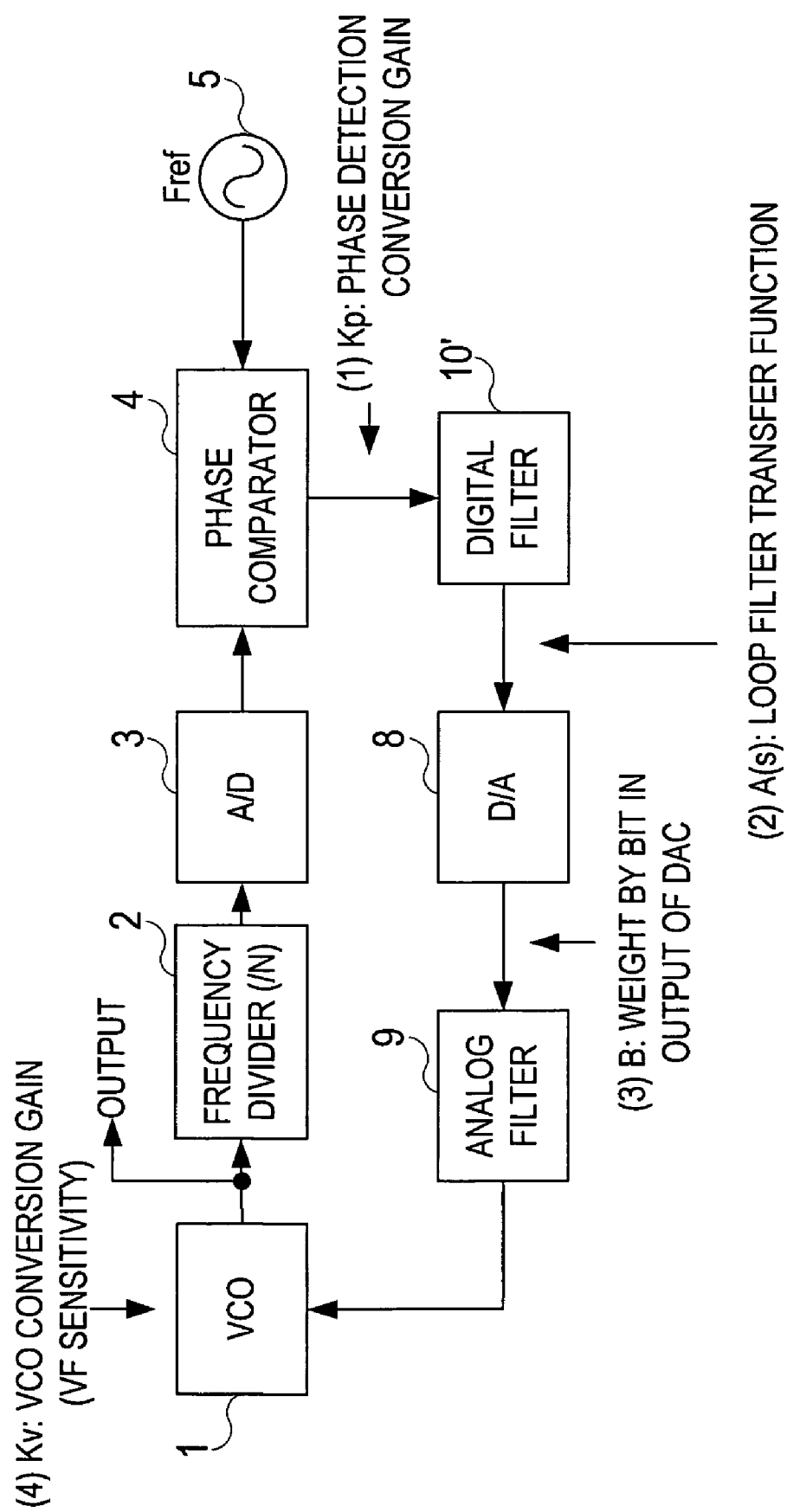
FIG. 7 is a block diagram schematically illustrating a configuration of a conventional PLL circuit.

Elements having the same configuration as shown in FIG. 7 are denoted by the same reference numerals or signs.

The PLL circuit (the present device) according to this embodiment, as shown in FIG. 1, includes a VCO 1, a 1/N frequency divider 2, an A/D converter 3, a phase comparator 4, a reference oscillator 5, an A/D converter 8, and an analog filter 9 as the same elements as the conventional PLL circuit shown in FIG. 7, and includes a first register (register (1) in the drawing) 6, a first multiplier 7, a digital filter 10 as a loop filter, a CPU (Central Processing Unit) 20, a correction value memory 21, and a temperature sensor 22 as characterized elements of the present device.

The digital filter 10 includes an integration circuit 11, a second register (register (2) in the drawing) 12, and a multiplier 13.

The characterized elements of the present device will be described.

The first register 6 serves to store a first parameter which is multiplied by the output of the phase comparator 4. The first parameter is a frequency correcting coefficient for varying a frequency band, which an excellent suppression characteristic can be obtained from, and is set as the optimal value depending on the use frequency band, the ambient temperature, and the individual difference of devices by the CPU 20. The operation of the CPU 20 is described later.

The first multiplier 7 serves to multiply a phase difference as the output of the phase comparator 4 by the first parameter output from the first register.

In the present device, the first register 6 and the first multiplier 7 are provided as means for varying the loop gain, and the CPU 20 can properly set the first parameter, thereby adjusting the output of the first multiplier 7 and varying the loop gain of the PLL circuit depending on the use frequency band and the temperature. Accordingly, the loop gain is adjusted to a proper value in a wide frequency band, thereby obtaining a stable suppression characteristic of suppressing a phase noise.

The second register 12 serves to store a second parameter which is multiplied by the output of the first multiplier 7. The second parameter is used to adjust a damping factor (response characteristic) and is set as the optimal value depending on the use frequency band, the ambient temperature, and the individual difference of devices by the CPU 20. The operation of the CPU 20 is described later.

The second multiplier 13 serves to multiply the output of the first multiplier 7 by the second parameter output from the second register 12. The multiplication result of the second multiplier is added to the output of the integration circuit 11 and the resultant is output from the digital filter 10.

In the present device, the second register 12 and the second multiplier 13 are provided as the means for varying the damping factor and the second parameter is properly set by the CPU 20, thereby varying the damping factor. Accordingly, the individual difference in response time of the device can be compensated for, thereby obtaining the stable suppression characteristic of suppressing the phase noise.

The temperature sensor 22 serves to periodically detect the ambient temperature of the device and to output the detected temperature to the CPU 20.

The correction value memory 21 stores various data used to generate the first and second parameters set in the first register 6 and the second register 12, respectively, by the CPU 20. The stored data include default parameters having the compensated individual difference, information on the use frequency band, and the temperature correction values corresponding to the use frequency bands.

Prior to specifically describing the data stored in the correction value memory 21, a method of calculating the first and second parameters in the present device and types of the parameters used therein will be described in brief.

First, in the present device, to obtain the optimal phase noise characteristic under a standard use condition, default parameters C1 and C2 having the compensated individual difference are stored as the parameters set in the first and second registers in the correction value memory 21.

Parameters for correcting the default parameters C1 and C2 include temperature parameters p1 and p2 for correction corresponding to the temperature and frequency tables subdivided by use frequencies are provided.

The parameters stored in the correction value memory 21 will be described now in detail.

First, the first default parameter C1 as the default value of the first parameter set in the first register 6 and the second default parameter C2 as the default value of the second parameter set in the second register 12 are stored in the correction value memory 21.

The default parameters are experimentally obtained to have values providing the optimal phase noise characteristic at the center frequency of the frequency band in which the present device is most often used at the normal temperature, where the values are determined to compensate for the individual difference due to differences in characteristic of the components of the device, and are written to the correction value memory 21 in advance.

That is, when the present device having an average operation characteristic is operated under the conditions (frequency and temperature) in which the default parameters are determined, the first parameter set in the first register 6 is the first default parameter C1 and the second parameter set in the second register 12 is the second default parameter C2.

The correction value memory 21 includes a temperature table storing coefficients for additionally compensating for the default parameters C1 and C2 depending on the use frequency band and the temperature.

Figure 2:
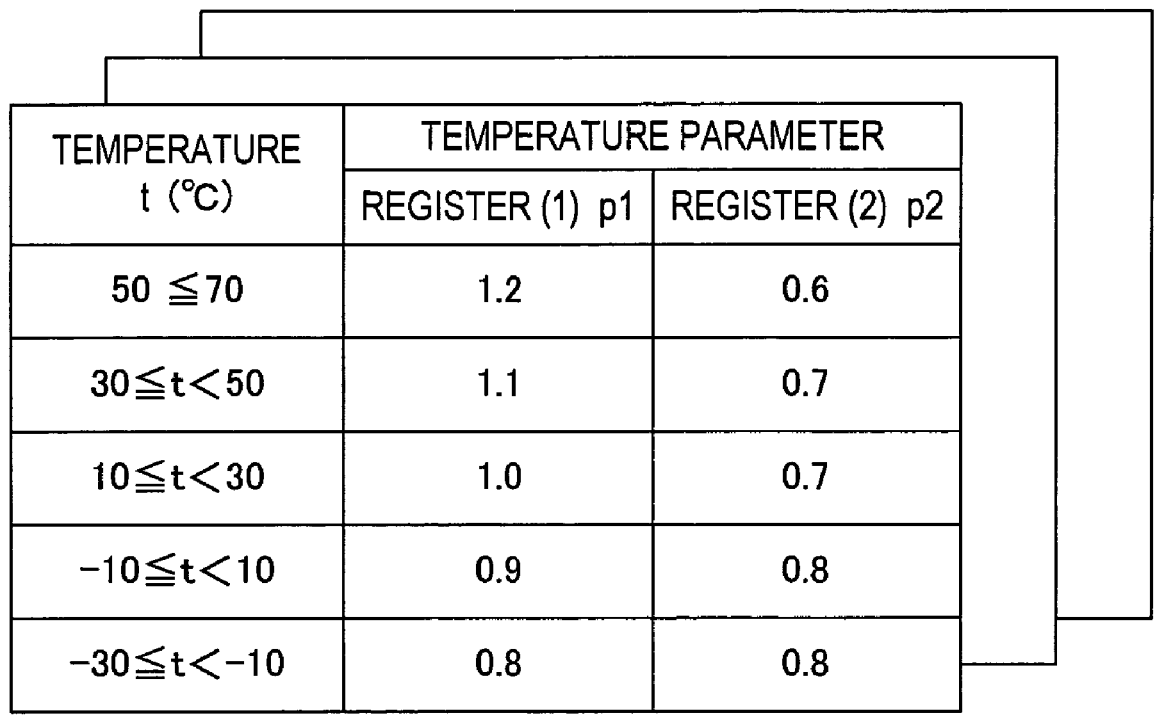
FIG. 2 is a diagram illustrating temperature tables stored in a correction value memory 21.

Here, the temperature table is described with reference to FIG. 2. FIG. 2 is a diagram illustrating the temperature table stored in the correction value memory 21.

As shown in FIG. 2, the temperature table stores the temperature parameter p1 for correcting the default parameter C1 set in the first register 6 and the temperature parameter p2 for correcting the default parameter C2 set in the second register 12 to correspond to the measured temperature (t). The temperature parameters p1 and p2 are experimentally obtained and written to the correction value memory 21 in advance.

As a feature of the present device, three type of temperature tables corresponding to a low frequency band (Low ch), a middle frequency band (Middle ch), and a high frequency band (High ch) are provided. An example of the temperature table corresponding to one frequency band is shown in FIG. 2. When the use frequency band is set by a setting unit, the CPU 20 selects and read the temperature table corresponding to the set use frequency band and performs the following processes with reference to the selected temperature table.

By providing the temperature tables corresponding to the frequency bands, it is possible to perform a temperature correcting process with high precision depending on the use frequency bands. A wide frequency band can be coped with by enhancing the temperature table to correspond to the frequencies.

The temperature table stores temperature parameters corresponding to the temperature width of 20 degrees in the temperature range of $-30°$ C. to $70°$ C. For example, when the measured temperature (t) is $25°$ C., 1.0 and 0.7 are stored as the temperature parameters p1 and p2, respectively. When the measured temperature (t) is $0°$ C., 0.9 and 0.8 are stored as the temperature parameters p1 and p2, respectively. The number of steps of the temperature width may be increased or decreased depending on the characteristics of the device.

When the measured temperature is out of the proper temperature range set particularly, the CPU 20 detects (outputs) a temperature alarm.

The CPU 20 reads the temperature table corresponding to the use frequency band, periodically reads the measured temperature (t) from the temperature sensor 22, reads the temperature parameter corresponding to the measured temperature with reference to the temperature table, adds the temperature parameter p1 or p2 to the default parameter C1 or C2 to generate the first parameter and the second parameter, and then writes the first and second parameters to the first register 6 and the second register 12, respectively.

Specifically, the first parameter set in the first register is C1+p1 and the second parameter set in the second register is C2+p2.

Next, the CPU 20 will be described.

The CPU 20 sets the optimal first parameter and the optical second parameter in the first register 6 and the second register 12, respectively, depending on the use frequency band, the ambient temperature, and the individual difference of the device.

Although not shown, a setting unit for an operator's external operation is connected to the CPU 20 and a use frequency band is input to the CPU from the setting unit. The frequency band is classified into the low frequency band (Low ch), the middle frequency band (Middle ch), and the high frequency band (High ch) and one thereof is set by the setting unit.

The CPU 20 stores the set frequency band in a memory (not shown) in the CPU 20 and as described above, reads the temperature table corresponding to the set frequency band from the correction value memory 21 before starting operation of the device.

The CPU 20 reads the default parameters C1 and C2 for compensating for the individual difference from the correction value memory 21 and stores the read default parameters, before starting the operation.

After starting the operation, the CPU periodically reads the measured temperature from the temperature sensor 22, multiplies the parameters having been subjected to the individual difference correcting process based on the temperature table by the temperature parameter to calculate the first and second parameters, and performs an updating process (temperature monitoring process) of updating the first register 6 and the second register 12.

Figure 3:
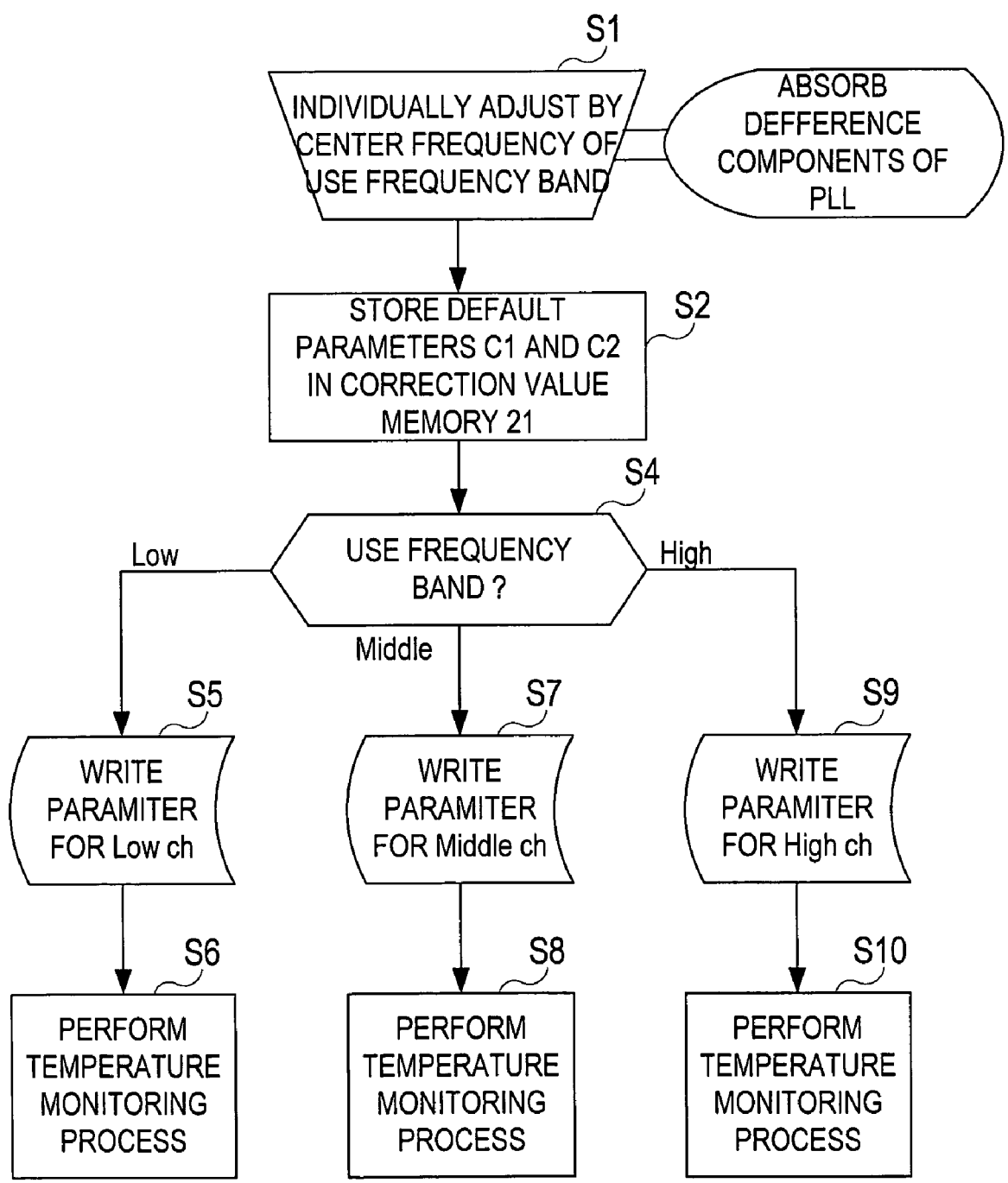
FIG. 3 is a flowchart illustrating a process of a CPU 20.

The processes of the CPU 20 will be described with reference to FIG. 3. FIG. 3 is a flowchart illustrating the processes of the CPU 20.

As shown in FIG. 3, before starting the operation, first in order to absorb characteristic differences of the components of the PLL circuit, an individual adjustment process is performed on the basis of the characteristic check result at the center frequency of the use frequency band at the normal temperature (S1) and the default parameters C1 and C2 for compensating for the individual difference are written to the correction value memory 21 (S2).

The CPU 20 reads the first and second default parameters C1 and C2 stored in the correction value memory and stores the read default parameters therein.

Then, the CPU 20 determines to which one of the low frequency band (Low ch), the middle frequency band (Middle ch), and the high frequency band (High ch) the use frequency band set by the setting unit belongs (S4). When the use frequency band belongs to the low frequency band (Low ch), the CPU reads the temperature table corresponding to the low frequency band from the correction value memory 21 and stores the read temperature table therein (S5). Then, the CPU 20 performs the temperature monitoring process of calculating the first and second parameters depending on the temperature (S6). The temperature monitoring process will be described later.

When the use frequency band belongs to the middle frequency band (Middle ch), the CPU 20 reads the temperature table corresponding to the middle frequency band from the correction value memory 21, stores the read temperature table therein (S7), and performs the temperature monitoring process of calculating the first and second parameters depending on the temperature (S8).

Similarly, when the use frequency band belongs to the high frequency band (High ch), the CPU 20 reads the temperature table corresponding to the high frequency band from the correction value memory 21, and stores the read temperature table (S9), and performs the temperature monitoring process of calculating the first and second parameters depending on the temperature (S10).

In this way, the processes of the CPU 20 are performed.

Figure 4:
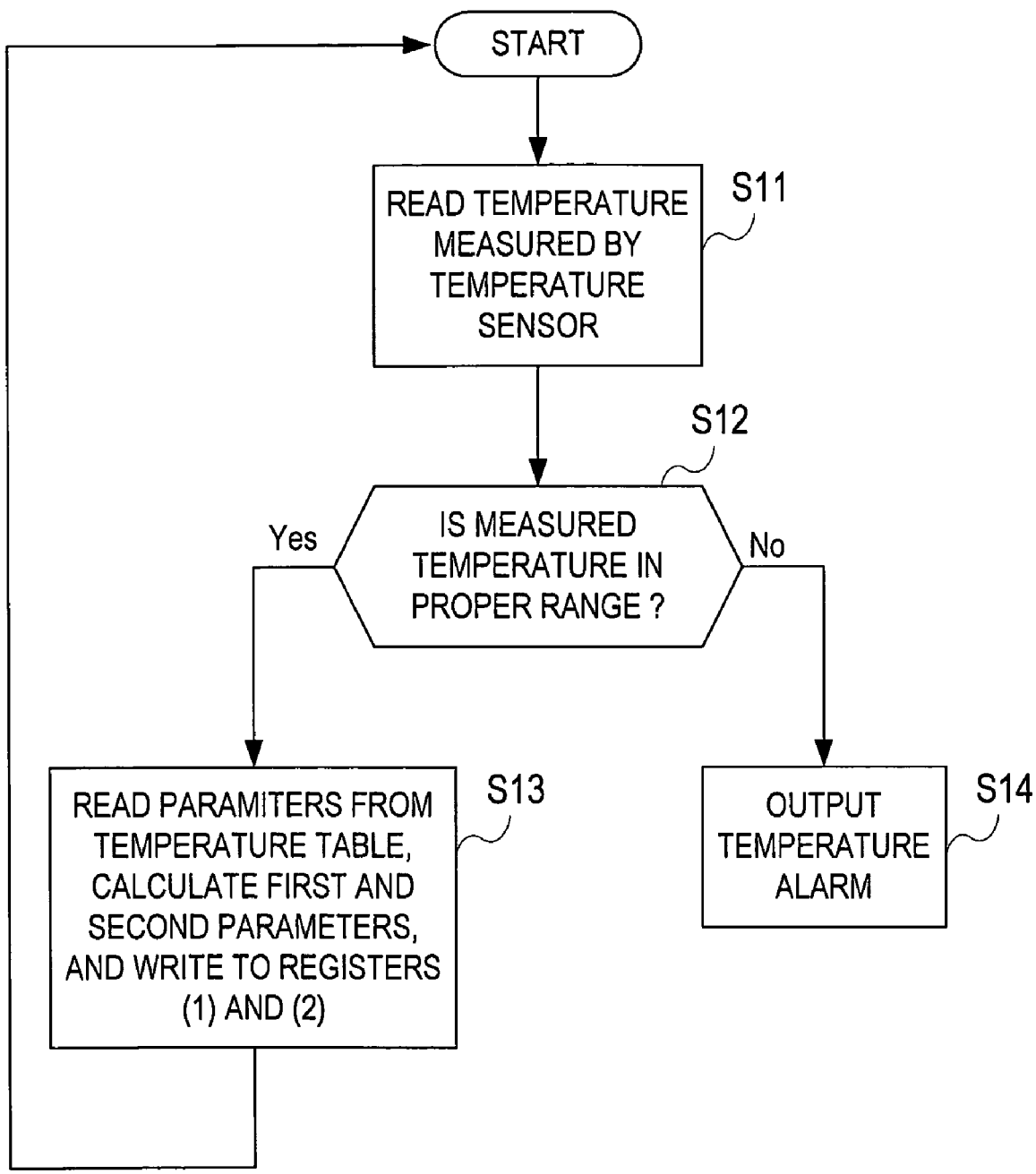
FIG. 4 is a flowchart illustrating a temperature monitoring process of the CPU 20.

Next, the temperature monitoring processes shown in steps S6, S8, and S10 of FIG. 3 will be described with reference to FIG. 4. FIG. 4 is a flowchart illustrating the temperature monitoring process of the CPU 20.

As shown in FIG. 4, when starting the temperature monitoring process, the CPU 20 periodically reads the temperature measured by the temperature sensor 22 (S11) and determines whether measured temperature is in a proper temperature range in which the device can properly operate (S12).

When the measured temperature is in the proper temperature range, the CPU 20 reads the temperature parameters p1 and p2 corresponding to the measured temperature from the temperature table, adds p1 to the first default parameter C1 stored therein to calculate the first parameter, adds p2 to the second default parameter C2 to calculate the second parameter, writes the first parameter to the first register 6, writes the second parameter to the second register 12 (S13), and then performs the process of step S11.

When the measured temperature is out of the proper temperature range in S12, the CPU 20 detects (outputs) a temperature alarm (S14).

In this way, the CPU 20 performs the temperature monitoring process.

By means of the processes shown in FIGS. 3 and 4, the present device can correct the default parameters by the use of the temperature parameters corresponding to the temperature periodically measured by the temperature sensor 22 with reference to the temperature table storing the optimal correction parameters corresponding to the use frequency on the basis of the default parameters C1 and C2 of which the difference due to the individual difference is compensated for, calculates and sets the first and second parameters in the first register 6 and the second register 12. Accordingly, it is possible to set the optimal parameters in the first register 6 and the second register 12 depending on the frequency band, the temperature, and the individual difference of the device, thereby varying the loop gain and the damping factor. As a result, it is possible to construct a PLL circuit having a stable suppression characteristic of suppressing a phase noise in a wide frequency band.

Figure 5:
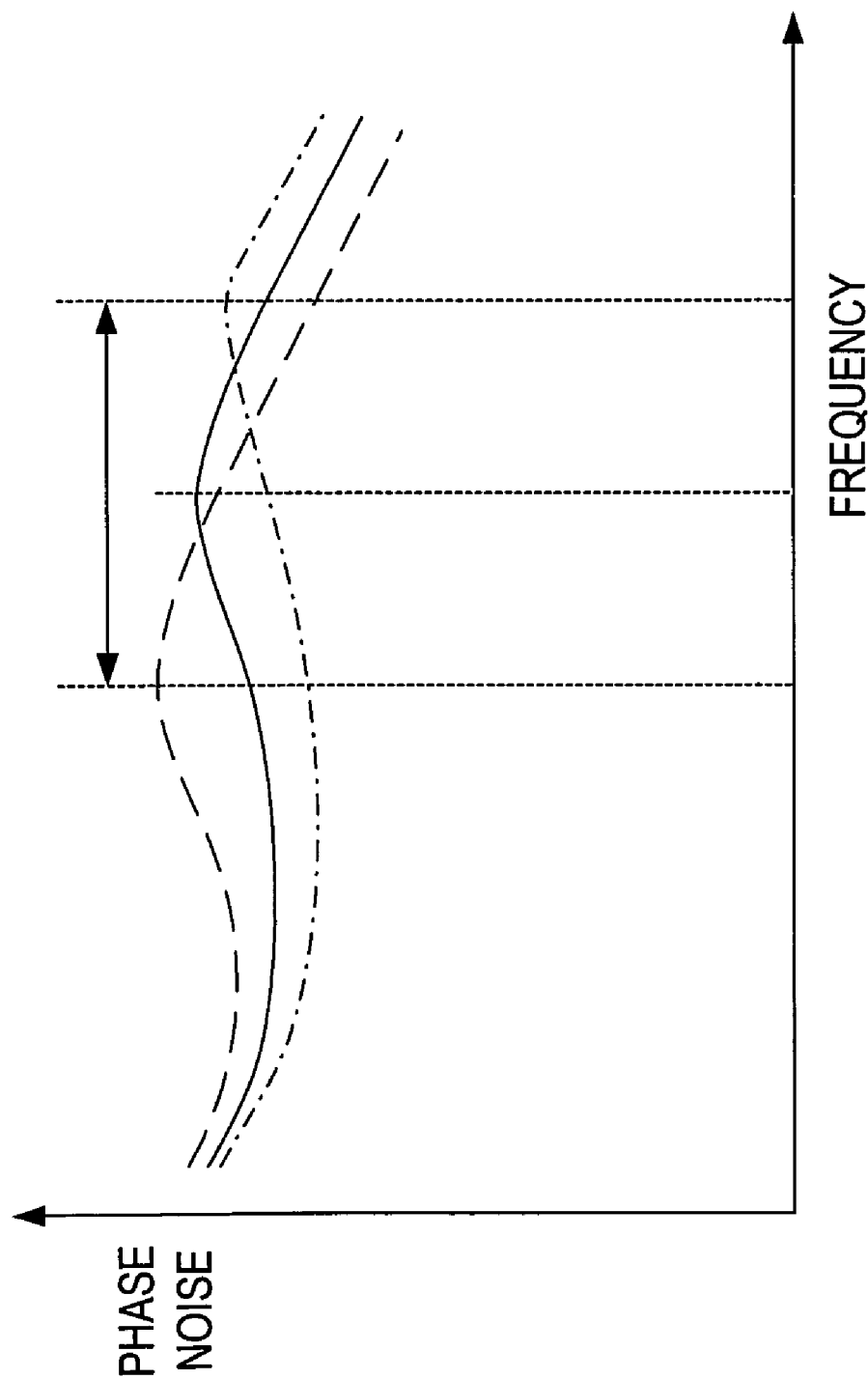
FIG. 5 is a diagram illustrating an advantage resulting from providing a first register 6 and a first multiplier 7.

Next, an advantage resulting from providing the first register 6 and the first multiplier 7 will be described with reference to FIG. 5. FIG. 5 is a diagram illustrating an advantage resulting from providing the first register 6 and the first multiplier 7.

As shown in FIG. 5, a loop suppression bandwidth providing a proper suppression characteristic of a phase noise in a graph of a dephasing frequency and a phase noise suppression characteristic is represented as an inflection point of the graph. In the example shown in FIG. 5, the phase noise characteristic of a reference device not provided with the first register 6 and the first multiplier 7 is indicated by a solid line and the phase noise characteristic of the device provided with the first register 6 and the first multiplier 7 to change the value of the parameter set in the first register 6 is indicated by a dot dashed line.

In the example shown in FIG. 5, a curve indicated by a dashed line represents a phase noise characteristic in which the peak is shifted to the low frequency in comparison with the reference device. A curve indicated by a dot dashed line represents a phase noise characteristic in which the peak is shifted to the high frequency in comparison with the reference device. Accordingly, it is possible to vary the loop suppression bandwidth by the use of the values of the parameters.

In this way, by setting the width by the use of the value of the parameter set in the first register 6 and adjusting the correction value to set a value in a wide range, it is possible to further widen the variable width of the suppression band.

Figure 6:
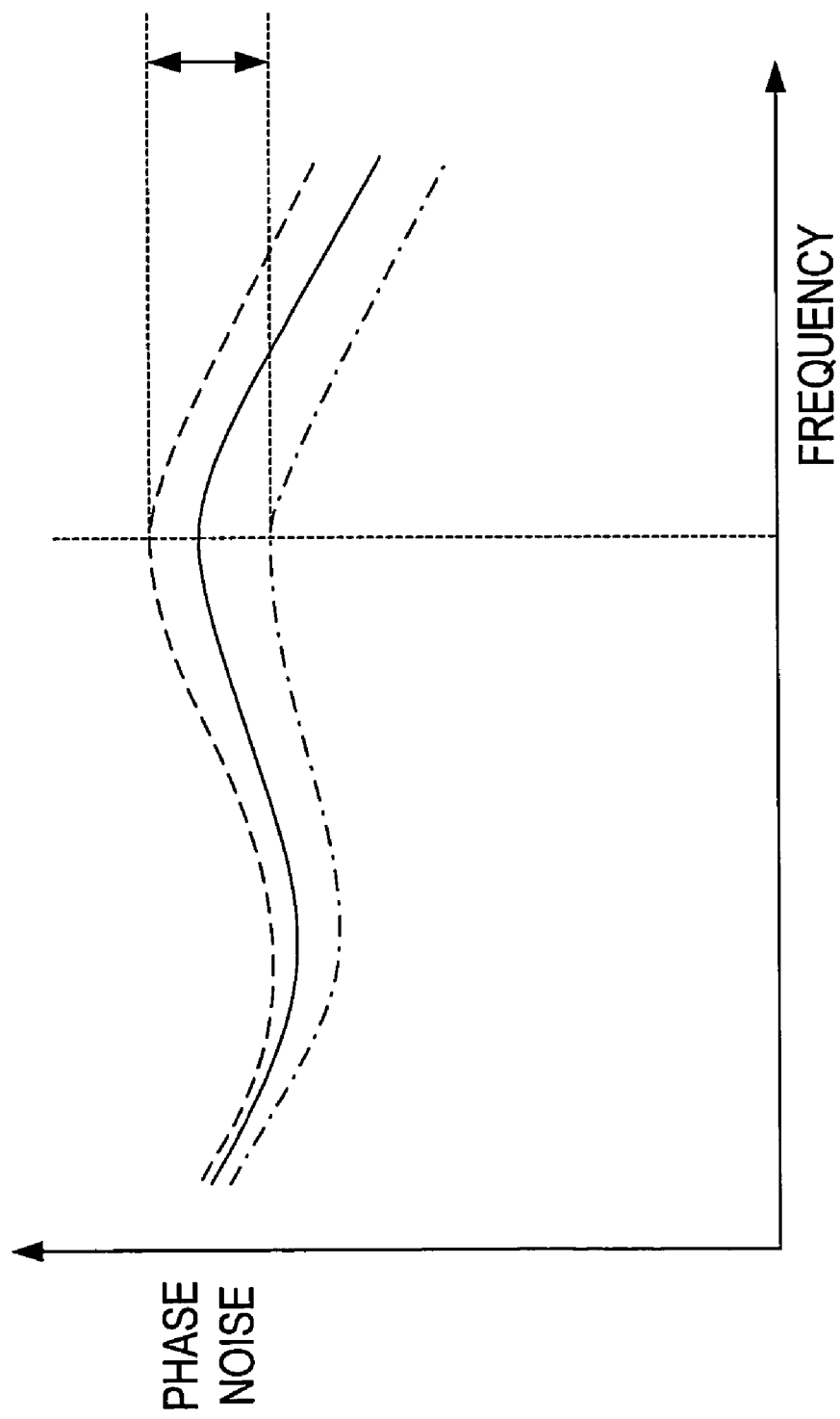
FIG. 6 is a diagram illustrating an advantage resulting from providing a second register 12 and a second multiplier 13.

Next, an advantage resulting from providing the second register 12 and the second multiplier 13 will be described with reference to FIG. 6. FIG. 6 is a diagram illustrating an advantage resulting from providing the second register 12 and the second multiplier 13.

In the example shown in FIG. 6, the phase noise characteristic of a device not provided with the second register 12 and the second multiplier 13 is indicated by a solid line and the phase noise characteristic of the device provided with the second register 12 and the second multiplier 13 to change the value of the parameter set in the second register 12 is indicated by a dot dashed line.

As shown in FIG. 6, by varying the value of the parameter set in the second register 12, it is possible to vary the damping factor, thereby varying the response speed. Accordingly, it is possible to obtain a phase noise characteristic with a different height of the peak without changing the peak position of the phase noise. Accordingly, it is possible to set the value of the second parameter so as to obtain a desired characteristic.

By setting the width by the use of the value of the parameter set in the second register 12 and adjusting the correction value to set a value in a wide range, it is possible to further widen the variable width of the damping factor.

That is, in the PLL circuit, as shown in FIGS. 5 and 6, it is possible to vary the loop gain and the damping factor by adjusting the parameters set in the first register 6 and the second parameter 12, thereby obtaining a desired phase noise characteristic.

The PLL circuit (the present device) according to the embodiment of the invention includes the first register 6 storing the first parameter for adjusting the loop gain, the first multiplier 7 multiplying the output of the phase comparator 4 by the first parameter, the second register 12 storing the second parameter for adjusting the damping factor, the second multiplier 13 multiplying the out of the first multiplier by the second parameter, and the CPU 20 setting the optimal parameters in the first and second registers depending on the use frequency band, the ambient temperature, and the individual difference of the device. Accordingly, the CPU 20 can adjust the loop gain and the damping factor to the optimum on the basis of the use frequency band, the ambient temperature, and the individual difference of the device, thereby obtaining a stable suppression characteristic of a phase noise in a wide frequency band.

The present device includes the correction value memory 21 storing the parameters used to calculate the first parameter and the second parameter and the temperature sensor 22 measuring the ambient temperature, the default parameters C1 and C2 experimentally obtained to compensate for the individual difference in the standard use condition in advance and the temperature parameters p1 and p2 correcting the default parameters depending on the temperature are stored in the correction value memory 21. Before starting the operation of the device, the CPU 20 reads and stores the default parameters C1 and C2. When starting the operation, the CPU adds the temperature parameters p1 and p2 corresponding to the measured temperature detected by the temperature sensor 22 to C1 and C2 to calculate the first and second parameters, and sets the calculated parameters in the first register 6 and the second register 12, respectively. Accordingly, by setting the default parameters on the basis of the individual difference before starting the operation and additionally correcting the default parameters by the use of the temperature parameters corresponding to the ambient temperature after starting the operation, it is possible to set the proper parameters having corrected based on the individual difference and the temperature in the first and second registers. As a result, it is possible to optimally adjust the loop gain and the damping factor, thereby obtaining a stable suppression characteristic of a phase noise in a wide frequency band.

In the present device, the temperature tables having the temperature parameters different depending on the use frequency bands are stored as the temperature parameters in the correction value memory 21. Accordingly, when the use frequency band is set, the CPU 20 reads the temperature tables corresponding to the frequency band from the correction memory 21 to perform the temperature correction with reference to the temperature table and can set the optimal parameters having been minutely corrected in temperature depending on the frequency in the first register and the second register. As a result, it is possible to optimally adjust the loop gain and the damping factor, thereby obtaining a stable suppression characteristic of a phase noise in a wide frequency band.

INDUSTRIAL APPLICABILITY

The invention is applicable to a PLL circuit that can obtain a stable suppression characteristic of a phase noise in a wide frequency band by preventing the deterioration in phase noise due to a variation in temperature or an individual difference of devices.

What is claimed is:

1. A PLL circuit comprising a voltage controlled oscillator oscillating a frequency corresponding to a control voltage, a reference frequency oscillator oscillating a constant frequency, a phase comparator comparing the output frequency of the reference frequency oscillator with the output frequency of the voltage controlled oscillator and outputting a phase difference, and a loop filter generating the control voltage on the basis of the phase difference, wherein loop gain varying means for varying a loop gain of the PLL circuit is disposed at an output stage of the phase comparator, wherein the loop gain varying means includes a first register storing a first parameter for adjusting a loop gain and a first multiplier multiplying the first parameter output from the first register by the output of the phase comparator, and wherein the PLL circuit further includes a controller setting the first parameter to compensate for an individual difference of the PLL circuit depending on a temperature in the first register on the basis of a device state and a use condition.

2. The PLL circuit according to claim 1, further comprising:

a correction value memory storing a first default parameter as the parameter set in the first register, and a temperature table including a first temperature parameter as correction value for correcting the first default parameter depending on a temperature in correlation with the temperature so as to compensate for an individual difference of the PLL circuit; and a temperature sensor detecting the temperature, wherein the controller sets a sum of the first default parameter and the first temperature parameter corresponding to the detected temperature as the first parameter in the first register, with reference to the temperature table depending on the temperature detected by the temperature sensor.

3. The PLL circuit according to claim 2, wherein the correction value memory includes the temperature tables corresponding to a plurality of use frequency bands, and wherein when the use frequency band is externally set, the controller refers to the temperature table corresponding to the set use frequency band.

4. A PLL circuit comprising a voltage controlled oscillator oscillating a frequency corresponding to a control voltage, a reference frequency oscillator oscillating a constant frequency, a phase comparator comparing the output frequency of the reference frequency oscillator with the output frequency of the voltage controlled oscillator and outputting a phase difference, and a loop filter generating the control voltage on the basis of the phase difference, wherein loop gain varying means for varying a loop gain of the PLL circuit and response characteristic varying means for varying a response characteristic of the PLL circuit are disposed at an output stage of the phase comparator, wherein the loop gain varying means includes a first register storing a first parameter for adjusting a loop gain and a first multiplier multiplying the first parameter output from the first register by the output of the phase comparator, wherein the response characteristic varying means includes a second register storing a second parameter for adjusting a response characteristic and a second multiplier receiving the branched output of the first multiplier and multiplying the second parameter output from the second register by the output of the first multiplier, and wherein the PLL circuit further includes a controller setting the first parameter to compensate for an individual difference of the PLL circuit depending on a temperature in the first register and the second parameter to compensate for an individual difference of the PLL circuit depending on a temperature in the second register on the basis of a device state and a use condition.

5. The PLL circuit according to claim 4, further comprising:

a correction value memory storing a first default parameter and a second default parameter as the parameters set in the first and second registers, respectively, and a temperature table including a first temperature parameter and a second temperature parameter as correction values for correcting the first and second default parameters depending on a temperature in correlation with the temperature so as to compensate for an individual difference of the PLL circuit; and a temperature sensor detecting the temperature, wherein the controller sets a sum of the first default parameter and the first temperature parameter corresponding to the detected temperature as the first parameter in the first register and sets a sum of the second default parameter and the second temperature parameter corresponding to the detected temperature as the second parameter in the second register, with reference to the temperature table depending on the temperature detected by the temperature sensor.

6. The PLL circuit according to claim 3, wherein the correction value memory includes the temperature tables corresponding to a plurality of use frequency bands, and wherein when the use frequency band is externally set, the controller refers to the temperature table corresponding to the set use frequency band.

* * * * *